US007286586B2

(12) United States Patent
Kondo

(10) Patent No.: US 7,286,586 B2
(45) Date of Patent: Oct. 23, 2007

(54) SEMICONDUCTOR INTEGRATED CIRCUIT HAVING A SURFACE-EMITTING LASER, MANUFACTURING METHOD OF THE SAME, AND ELECTRONIC EQUIPMENT

(75) Inventor: Takayuki Kondo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 519 days.

(21) Appl. No.: 10/785,017

(22) Filed: Feb. 25, 2004

(65) Prior Publication Data

US 2004/0184495 A1 Sep. 23, 2004

(30) Foreign Application Priority Data

Mar. 11, 2003 (JP) .............................. 2003-065097

(51) Int. Cl.
*H01S 5/00* (2006.01)

(52) U.S. Cl. ................................ 372/50.21; 372/50.124

(58) Field of Classification Search ............. 372/50.21, 372/50.124

See application file for complete search history.

(56) References Cited

U.S. PATENT DOCUMENTS

| | | | | |
|---|---|---|---|---|
| 5,724,376 A | * | 3/1998 | Kish et al. ..................... | 372/96 |
| 5,832,017 A | * | 11/1998 | Ramdani et al. .......... | 372/45.01 |
| 5,838,703 A | * | 11/1998 | Lebby et al. ............. | 372/50.21 |
| 6,093,938 A | * | 7/2000 | Minemier et al. ............. | 257/80 |
| 6,835,992 B1 | * | 12/2004 | Swirhun et al. ............. | 257/461 |
| 6,999,493 B2 | * | 2/2006 | Kaneko ....................... | 372/101 |

FOREIGN PATENT DOCUMENTS

JP  A 9-198707  7/1997

* cited by examiner

*Primary Examiner*—Armando Rodriguez
(74) *Attorney, Agent, or Firm*—Oliff & Berridge PLC

(57) ABSTRACT

A semiconductor integrated circuit is provided having a surface-emitting laser that makes it possible to precisely monitor the amount of light emitted by the surface-emitting laser for a long period of time, to be miniaturized, and to be easily manufactured. A method to manufacture a semiconductor integrated circuit and electronic equipment is also provided. The semiconductor integrated circuit having a surface-emitting laser includes a transparent substrate, the surface-emitting laser composed of a micro tile-like element that is adhered to the transparent substrate, an integrated circuit chip that is flip-chip mounted on the transparent substrate and is arranged so as to cover the surface-emitting laser and a photodiode that is included in the integrated circuit chip and is arranged so as to face the surface-emitting laser.

15 Claims, 16 Drawing Sheets

SEMICONDUCTOR INTEGRATED CIRCUIT HAVING A SURFACE-EMITTING LASER, MANUFACTURING METHOD OF THE SAME, AND ELECTRONIC EQUIPMENT

BACKGROUND OF THE INVENTION

1. Field of Invention

The present invention relates to a semiconductor integrated circuit having a surface-emitting laser, a manufacturing method of the same, and electronic equipment.

2. Description of Related Art

Since the efficiency of a semiconductor laser varies depending on ambient temperatures and other factors, it is necessary to monitor and control the amount of laser light from an optical point of view. Some related art edge emitting lasers are mounted on a side of a pillar base called a stem. For such lasers, the amount of laser light is monitored by utilizing rear light.

Unlike edge emitting lasers, it is difficult to utilize rear light for surface-emitting lasers because light is emitted from a semiconductor surface. Therefore, methods to monitor the amount of light shown in FIG. 16 have been invented. As this figure shows, the amount of laser light L10 emitted from a surface-emitting laser 51 is monitored by using reflected light L20 that is reflected on a glass surface 52 of a package 50 that covers the surface-emitting laser 51 and a light receiving element 53.

However, the above-mentioned related art method to monitor the amount of light emitted by a surface-emitting laser involves the following problems. Since it requires the package 50 that covers the surface-emitting laser 51 and the light receiving element 53, it is difficult to reduce the size of a whole light emitting device. Moreover, since the amount of reflected light L20 may vary due to dirt on, or deformation of, the glass surface 52, it is difficult to accurately monitor the amount of light emitted by a surface-emitting laser for a long period of time.

In consideration of these problems, the invention provides a semiconductor integrated circuit having a surface-emitting laser that makes it possible to precisely monitor the amount of light emitted by the surface-emitting laser for a long period of time, to be miniaturized, and to be easily manufactured. The invention also provides methods to manufacture the semiconductor integrated circuit and electronic equipment.

SUMMARY OF THE INVENTION

To address the above problems, a semiconductor integrated circuit having a surface-emitting laser according to an aspect of the invention includes a transparent substrate, the surface-emitting laser including a micro tile-like element that is adhered to the transparent substrate, an integrated circuit chip that is flip-chip mounted on the transparent substrate and is arranged so as to cover the surface-emitting laser, and a light receiving device that is included in the integrated circuit chip and is arranged so as to face the surface-emitting laser.

According to an aspect of the invention, the surface-emitting laser including the micro tile-like element emits laser light in two directions. Laser light in one direction is emitted from the back surface side of the surface-emitting laser, passes through the transparent substrate, and goes out as front light. Laser light in the other direction is emitted from the surface side of the surface-emitting laser and enters the light receiving device. Thus, an aspect of the invention makes it possible to monitor the output of the surface-emitting laser. Since the integrated circuit chip is arranged so as to cover the surface-emitting laser, the integrated circuit chip blocks ambient light incident on the light receiving device. This makes it possible to precisely monitor the output of the surface-emitting laser.

Also according to an aspect of the invention, since the integrated circuit including the light receiving device is flip-chip mounted on the transparent substrate, it is possible to easily manufacture a semiconductor integrated circuit that is capable of precisely monitoring the output of the surface-emitting laser, using existing technologies. Also, since the integrated circuit is flip-chip mounted on the transparent substrate, a gap between the surface-emitting laser and the light receiving device is created. This reduces the likelihood of or prevents the surface-emitting laser from being damaged because of a contact between the surface-emitting laser and the light receiving device.

Also according to an aspect of the invention, since the surface-emitting laser includes the micro tile-like element, it is possible to significantly miniaturize a semiconductor integrated circuit that is capable of monitoring the output of the surface-emitting laser. Here, the micro tile-like element may be composed of a compound semiconductor or a silicon semiconductor. Also, a substrate to which the micro tile-like element is adhered may be a silicon semiconductor substrate or a compound semiconductor substrate. Therefore, it is possible to form a hybrid substrate in which a compound semiconductor and a silicon semiconductor are combined in three dimensions (a semiconductor integrated circuit capable of precisely monitoring the output of the surface-emitting laser) that is significantly compact in size, which is impossible for a related art monolithic substrate.

The light receiving device may be a photodiode in the semiconductor integrated circuit having a surface-emitting laser according to an aspect of the invention.

Thus, it is possible to easily form a semiconductor integrated circuit including the combination of the surface-emitting laser and a photodiode or a phototransistor that is significantly compact in size, which is impossible for a related art monolithic substrate.

The photodiode may be an MSM photodiode in the semiconductor integrated circuit having a surface-emitting laser according to an aspect of the invention.

By forming the light receiving device with an MSM photodiode, it is possible to accurately detect the amount of light of high-speed optical signals output by the surface-emitting laser with a high response. This makes it possible to more precisely monitor the output of the surface-emitting laser.

A light receiving part of the light receiving device may be positioned on an optical axis of the surface-emitting laser in the semiconductor integrated circuit having a surface-emitting laser according to an aspect of the invention.

This makes it possible more precisely to detect the output (the amount of light) of the surface-emitting laser.

The integrated circuit chip may include an auto power control circuit that controls an amount of light emitted by the surface-emitting laser based on an amount of light detected by the light receiving device in the semiconductor integrated circuit having a surface-emitting laser according to an aspect of the invention.

Thus it is possible to easily form a semiconductor integrated circuit that is capable of automatically controlling the amount of light emitted by the surface-emitting laser and is compact in size. Therefore, it is possible to economically provide a semiconductor integrated circuit that outputs the intended amount of laser light in a stable manner for a long period of time regardless of temperature changes, aging, and product quality, and that is compact in size.

The integrated circuit chip may include a signal processing circuit and an output signal of the signal processing circuit may be an input signal to the surface-emitting laser in the semiconductor integrated circuit having a surface-emitting laser according to an aspect of the invention.

Thus, by providing a parallel/serial converter circuit, for example, as the signal processing circuit, it is possible to input parallel signals, such as CPU output signals directly to the integrated circuit chip, convert the signals into serial signals, and output them as optical pulse signals. This makes it possible to easily form a bus etc. that operates at high speed and is significantly compact in size. Examples of the signal processing circuit may include modulator circuits of various types, an A/D converter, a D/A converter, a video signal processing circuit, a voice signal processing circuit, an encryption circuit, and a decryption circuit.

The transparent substrate may include an auto power control circuit that controls an amount of light emitted by the surface-emitting laser based on an amount of light detected by the light receiving device in the semiconductor integrated circuit having a surface-emitting laser according to an aspect of the invention.

Thus it is possible to easily form a semiconductor integrated circuit that is capable of automatically controlling the amount of light emitted by the surface-emitting laser and is compact in size. Therefore, it is possible to economically provide semiconductor integrated circuit that outputs the intended amount of laser light regardless of temperature changes, aging, and product quality, and that is compact in size.

The transparent substrate may include a signal processing circuit and an output signal of the signal processing circuit may be an input signal to the surface-emitting laser in the semiconductor integrated circuit having a surface-emitting laser according to an aspect of the invention.

Thus, by providing a parallel/serial converter circuit, for example, as the signal processing circuit, it is possible to input parallel signals, such as CPU output signals directly to the transparent substrate and transmit the signals from the transparent substrate to the surface-emitting laser of the integrated circuit chip. Examples of the signal processing circuit may include modulator circuits of various types, an A/D converter, a D/A converter, a video signal processing circuit, a voice signal processing circuit, an encryption circuit, and a decryption circuit.

Also, the transparent substrate may be provided with a CPU, a storage circuit and various interface circuits, a wireless signal transmitting/receiving circuit, a liquid crystal display circuit, an electroluminescence display circuit, and a plasma display circuit.

The transparent substrate may include a lens that is positioned on an optical axis of the surface-emitting laser in the semiconductor integrated circuit having a surface-emitting laser according to an aspect of the invention.

Thus, laser light emitted from the surface-emitting laser adhered to one side of the transparent substrate is converged and diverged by the lens (convex or concave lens etc.) provided to the other side of the transparent substrate, for example. This makes it possible to have an intended divergence angle of laser light emitted from the surface-emitting laser, and to set the focus of its laser light at an intended position. Therefore, it is possible to easily manufacture optical communication modules, compact disc systems, and pulse wave detection systems that are significantly compact in size with the semiconductor integrated circuit of an aspect of the invention.

The surface-emitting laser may be adhered to the surface of the transparent substrate and the lens may be provided to the back surface of the transparent substrate in the semiconductor integrated circuit having a surface-emitting laser according to an aspect of the invention.

Thus, it is possible to easily provide a semiconductor integrated circuit that outputs laser light of an intended light amount and intended state, and is compact in size.

The transparent substrate may include a diffraction grating that is positioned on an optical axis of the surface-emitting laser in the semiconductor integrated circuit having a surface-emitting laser according to an aspect of the invention.

Thus, laser light emitted from the surface-emitting laser adhered to one side of the transparent substrate is converged, diverged, changed in its path and divided by the diffraction grating provided to the other side of the transparent substrate, for example. Therefore, it is possible to easily manufacture various electronic equipment that is significantly compact in size with the semiconductor integrated circuit of an aspect of the invention.

The surface-emitting laser may be adhered to the surface of the transparent substrate and the diffraction grating may be provided to the back surface of the transparent substrate in the semiconductor integrated circuit having a surface-emitting laser according to an aspect of the invention.

Thus, it is possible to easily provide a semiconductor integrated circuit that outputs laser light of an intended light amount and intended state, and is compact in size.

The light receiving device may have wavelength selectivity in the semiconductor integrated circuit having a surface-emitting laser according to an aspect of the invention.

Thus, only light emitted from the surface-emitting laser is detected by the light receiving device, for example. This makes it possible to precisely detect the amount of light emitted from the surface-emitting laser without being affected by ambient light.

A light receiving part of the light receiving device may be provided with a filter that transmits only light of an intended wavelength in the semiconductor integrated circuit having a surface-emitting laser according to an aspect of the invention.

The surface-emitting laser may be adhered to the transparent substrate with adhesive that is transparent at least in the semiconductor integrated circuit having a surface-emitting laser according to an aspect of the invention.

Thus, it is possible to reduce or prevent laser light emitted from the surface-emitting laser to the transparent substrate from being blocked by adhesive between the surface-emitting laser and the transparent substrate.

The micro tile-like element may include a lower multilayered reflective layer, an active layer that is provided above the lower multilayered reflective layer, and an upper multilayered reflective layer that is provided above the active layer in the semiconductor integrated circuit having a surface-emitting laser according to an aspect of the invention.

Thus, the surface-emitting laser is formed as the micro tile-like element by stacking the lower multilayered reflective layer (or a distributed bragg reflector (DBR) multilayer whose depth is 4 micrometers, for example), the active layer, and the upper multilayered reflective layer (or a DBR multilayer whose depth is 4 micrometers, for example) from the bottom in this order. Here, the lower multilayered reflective layer, the active layer, and the upper multilayered reflective layer may be pillar-shaped and form a pillar-shaped surface-emitting laser. Alternatively, for example, only the lower multilayered reflective layer may have a micro tile-like shape, and the active layer and the upper multilayered reflective layer, each of which has a smaller plane than the lower multilayered reflective layer and are pillar-shaped, may be stacked on part of the upper surface of the lower multilayered reflective layer.

This makes it possible to provide a surface-emitting laser that is easy to install and provides high optical performance.

The micro tile-like element may be formed by forming a semiconductor element on a semiconductor substrate and separating only a function layer that is a surface layer of the semiconductor substrate and includes the semiconductor element from the semiconductor substrate in the semiconductor integrated circuit having a surface-emitting laser according to an aspect of the invention.

Thus, it is possible to form the semiconductor integrated circuit by adhering the semiconductor element (the surface-emitting laser), that is separated from the semiconductor substrate as the micro tile-like element, to a selected substance (a transparent substrate). Here, the semiconductor element may be composed of a compound semiconductor or a silicon semiconductor. Also, a substance (a transparent substrate) to which the semiconductor element is adhered may be a silicon semiconductor substrate, a compound semiconductor substrate, or other suitable materials (e.g. plastic, glass). This makes it possible to form a semiconductor element on a substrate made of a different material from that of the semiconductor substrate, for example, the surface-emitting laser made of GaAs may be formed on a plastic substrate (transparent substrate). Also, since a micro tile-like element is cut out and separated after the surface-emitting laser is formed on a semiconductor substrate, it is possible to select the surface-emitting laser through testing in advance.

The micro tile-like element may be formed by forming a semiconductor element on a semiconductor substrate, adhering a film to the semiconductor element side of the semiconductor substrate, and separating only a function layer including the semiconductor element from the semiconductor substrate in the semiconductor integrated circuit having a surface-emitting laser according to an aspect of the invention Thus, only the function layer including a semiconductor element (the surface-emitting laser) is separated from the semiconductor substrate as the micro tile-like element and mounted on the film to be handled. Thus, it is possible to selectively adhere the semiconductor element (the surface-emitting laser, that is, the micro tile-like element) to a final substrate (the transparent substrate), which enables the miniaturization of the micro tile-like element, compared to lasers formed from related art methods. Consequently, it is possible to easily provide a semiconductor integrated circuit that outputs laser light of an intended light amount and intended state, and is compact in size.

Electronic equipment according to an aspect of the invention includes the semiconductor integrated circuit.

Thus, it is possible to economically provide a semiconductor integrated circuit that outputs the intended amount of laser light in a stable manner for a long period of time, and that is compact in size. Therefore, it is possible to economically and more precisely provide electronic equipment, such as optical communication modules as a light source of an optical fiber communication system, pulse wave detection systems that detect pulse waves using laser light and compact disc systems, that are compact in size.

A method to manufacture a semiconductor integrated circuit according to an aspect of the invention includes: forming a surface-emitting laser composed of a micro tile-like element; adhering the surface-emitting laser to one side of a transparent substrate; flip-chip mounting an integrated circuit chip having at least a light receiving device on one side of the transparent substrate; providing the integrated circuit chip so as to cover the surface-emitting laser; and arranging the integrated circuit chip and the light receiving device so as to make a light emitting surface of the surface-emitting laser face a light receiving surface of the light receiving device.

Thus, it is possible to easily manufacture a semiconductor integrated circuit that is capable of precisely monitoring output from the surface-emitting laser using existing technologies. Also, this easily enables the miniaturization of the semiconductor integrated circuit.

The method to manufacture a semiconductor integrated circuit according to an aspect of the invention may further include: providing an auto power control circuit that controls an amount of light emitted by the surface-emitting laser based on an amount of light detected by the light receiving device before flip-chip mounting the integrated circuit chip.

Thus, it is possible to economically provide a semiconductor integrated circuit that outputs the intended amount of laser light for a long period of time regardless of temperature changes and aging and that is compact in size.

The method to manufacture a semiconductor integrated circuit according to an aspect of the invention may further include: providing one of a lens and a diffraction grating at a position where an optical axis of the surface-emitting laser is crossing on the other side of the transparent substrate.

Thus, it is possible to converge, diverge, change a path of, and divide light emitted from the surface-emitting laser. Therefore, it is possible to easily manufacture various electronic equipment that are significantly compact in size with the semiconductor integrated circuit of an aspect of the invention.

DETAILED DESCRIPTION OF EXEMPLARY EMBODIMENTS

Referring to the accompanying drawings, a semiconductor integrated circuit having a surface-emitting laser according to an aspect of the invention will now be described.

Figure 1:
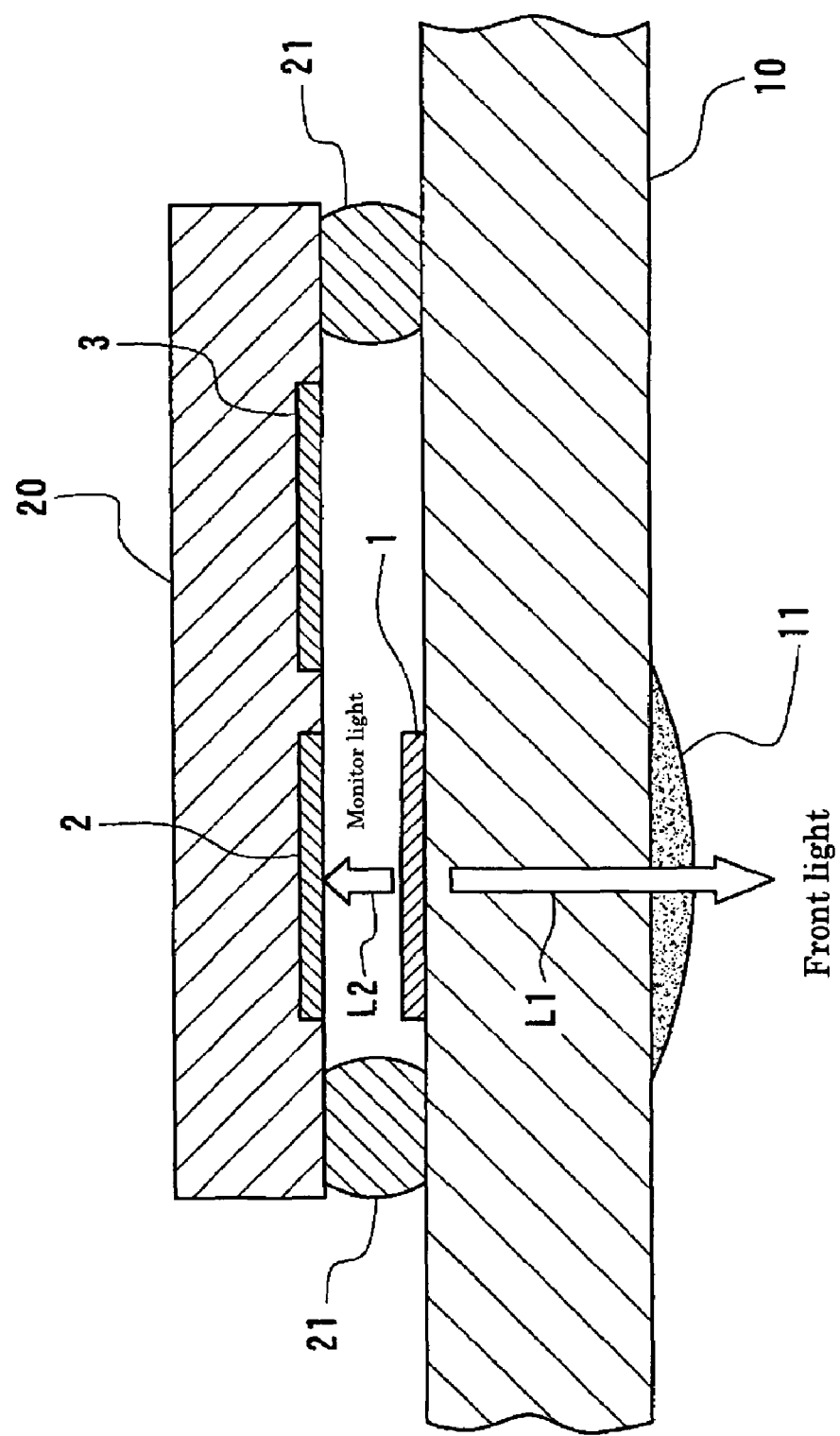
FIG. 1 is a sectional view schematically showing a semiconductor integrated circuit according to an exemplary embodiment of the invention.

FIG. 1 is a sectional view schematically showing a semiconductor integrated circuit according to an exemplary embodiment of the invention. The semiconductor integrated circuit includes a transparent substrate 10, a surface-emitting laser 1, and an integrated circuit chip 20. The surface-emitting laser 1 is composed of a micro tile-like element that is adhered to the upper surface of the transparent substrate 10. The integrated circuit chip 20 is flip-chip mounted on the transparent substrate 10.

The micro tile-like element in which the surface-emitting laser 1 is formed is a micro tile-like (plate) semiconductor device. It is a square plate member. Its depth is several dozen micrometers or less. Its area is several hundred square micrometers or less. The micro tile-like element includes a laser portion that performs a function as a surface-emitting laser 1 and a micro tile portion that is shaped like a micro tile and is coupled to the laser portion. The micro tile portion is transparent to light emitted from the laser portion. The laser portion emits laser light in a direction toward the upper surface and the bottom (for example, front light L1 and monitor light L2). Here, the micro tile portion is made so thin and transparent that laser light emitted toward the bottom smoothly passes through the micro tile portion.

The micro tile-like element may be adhered to the transparent substrate 10 with adhesive that is transparent. A method to manufacture the micro tile-like element and a method to adhere the micro tile-like element (the surface-emitting laser 1) to the transparent substrate 10 will be described in greater detail later. Here, the shape of the micro tile-like element in which the surface-emitting laser 1 is formed may include, but not be limited to, a square.

Examples of the transparent substrate 10 may include a substrate made of glass, plastic, glass epoxy, ceramic, semiconductor, and silicon. The integrated circuit chip 20 is flip-chip mounted on the transparent substrate 10 via a bonding pad (not shown in the drawings) provided in an pre-determined position on the transparent substrate, and a bump 21 that is made of an electrically conductive member. A circuit, included in the integrated circuit chip 20, is electrically coupled to wiring (not shown in the drawings) provided in the transparent substrate 10 via the bump 21 and the bonding pad. The wiring of the transparent substrate 10 is electrically coupled to the surface-emitting laser 1. Therefore, the surface-emitting laser 1 is electrically coupled to the circuit included in the integrated circuit chip 20 via the bump 21 etc.

The integrated circuit chip 20 is provided so as to cover the surface-emitting laser 1 on the transparent substrate 10. The integrated circuit chip 20 includes a photodiode 2 that is a light receiving element, and an auto power control (APC) driver circuit 3 that controls the amount of light (output) emitted by the surface-emitting laser 1 based on the amount detected by the photodiode 2. The photodiode 2 is placed above the surface-emitting laser 1 so as to face the laser. It is preferable that a light receiving portion of the photodiode 2 is placed on the optical axis of the surface-emitting laser 1. Here, a phototransistor may replace the photodiode 2. The photodiode 2 is preferably an MSM photodiode.

Figure 2:
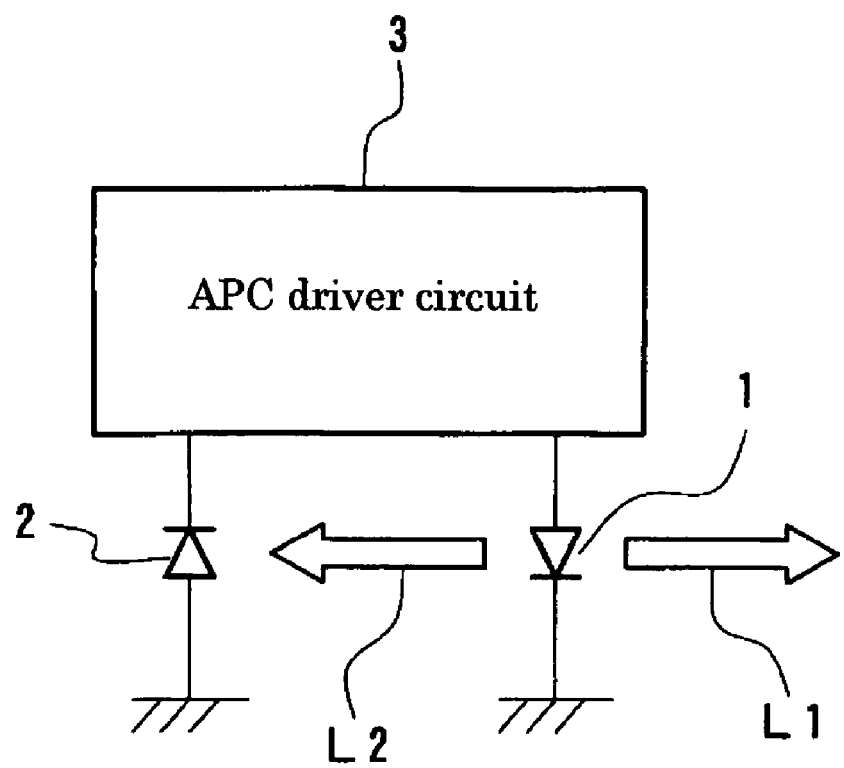
FIG. 2 shows APC operations of the semiconductor integrated circuit.

Referring now to FIG. 2, the control of output from the surface-emitting laser 1 by the APC driver circuit 3 will be described. First, the monitor light L2 is emitted from the upper surface of the surface-emitting laser 1, while the front light L1 is emitted from the bottom of the surface-emitting laser 1. The front light L1 passes through the transparent substrate 10. It is used as carrier light in optical communications, as pickup light in compact disc systems and as pulse wave detection light that analyzes human pulse waves and diagnoses physical conditions in pulse wave detection systems. The amount of the front light L1 from the surface-emitting laser 1 is equal or in proportion to the amount of monitor light L2 from the surface-emitting laser 1. Therefore, if the amount of the front light L1 decreases, the amount of monitor light L2 also decreases in proportion to the front light L1.

The monitor light L2 enters the photodiode 2. Thus, a current corresponding to the amount of the monitor light L2 runs in the photodiode 2. Then the APC driver circuit 3 converts the amount of current running in photodiode 2 into a detection signal as a detected amount and compares the amount with a predetermined reference amount. Subsequently, the APC driver circuit 3 controls driving voltage or driving currents of the surface-emitting laser 1 so as to adjust results of the comparison to be fixed. This makes it possible to retain the intended amount of light (the front light L1 and the monitor light L2) emitted from the surface-emitting laser 1, by feeding back and controlling the amount, for a long period of time regardless of ambient temperatures and aging.

Here, instead of providing the integrated circuit chip 20 with the APC driver circuit 3, the transparent substrate 10 may be provided with the APC driver circuit 3. The APC driver circuit 3 may be separated into an APC circuit portion and a driver portion. The APC circuit portion may be further separated into a detection circuit (including a preamplifier) that detects output from the photodiode 2, and an APC circuit.

According to this exemplary embodiment, since the integrated circuit chip 20 including the photodiode 2 and the APC driver circuit 3, is flip-chip mounted on the transparent substrate 10, it is possible to easily manufacture a significantly compact semiconductor integrated circuit that is capable of precisely monitoring output from the surface-emitting laser 1 using existing technologies. Also, since the integrated circuit chip 20 is flip-chip mounted on the transparent substrate 10, a gap between the surface-emitting laser 1 and the photodiode 2 is created. This reduces the likelihood or prevents the surface-emitting laser 1, that is small and thin, from being damaged because of a contact between the surface-emitting laser 1 and the photodiode 2.

A lens 11 is provided at the bottom of the transparent substrate 10. The lens 11 is provided so that the center of the lens 11 is on the optical axis of the surface-emitting laser 10. Therefore, light beams of the front light L1, emitted from the surface-emitting laser 10, are converged or diverged by the lens 11. This makes it possible to have an intended divergence angle of the front light L1 and to set the focus of its laser light at an intended position.

By using the front light L1 passing through the lens 11, it is possible to easily manufacture optical communication modules, compact disc systems, and pulse wave detection systems that are compact in size. The lens 11 may be formed by grinding one surface of the transparent substrate 10 after chemical or mechanical processing or by attaching a lens unit to the transparent substrate 10. Also, the lens may be formed by dropping a liquid resin etc. on the transparent substrate 10 and having the drop hardened. Alternatively, the transparent substrate 10 may be provided with a lens in advance by an injection molding method or a mold transfer method using a stamper. Furthermore, by using a phenomenon where refractive indexes vary when ions are diffused on a transparent substrate, the lens 11 may be formed by making refractive indexes uneven so as to make a lens by locally diffusing ions on the transparent substrate 10.

Figure 17:
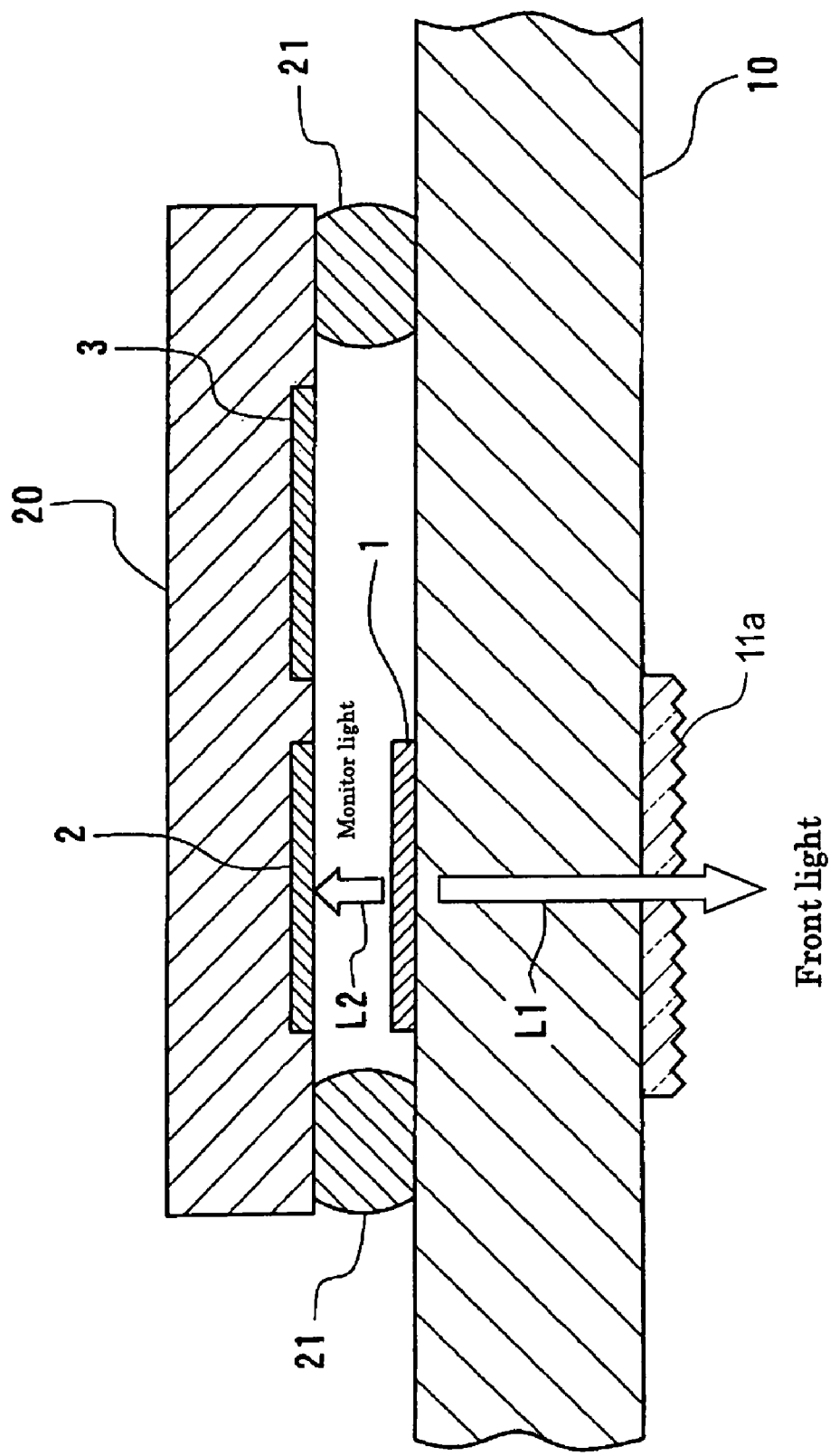
FIG. 17 is a sectional view schematically showing a semiconductor integrated circuit according to an exemplary embodiment of the invention.

As shown in FIG. 17, a diffraction grating 11a may replace the lens 11 on the transparent substrate 10. The diffraction grating 11a converges or diverges the front light L1. By having the diffraction grating 11a shaped in an intended formation, it is possible to change a path of the front light L1 and split the front light L1. Therefore, by using the diffraction grating 11a instead of the lens 11, it is possible to easily manufacture various electronic equipment utilizing laser light that are compact in shape.

A filter that only transmits light of an intended wavelength (for example, the wavelength of light emitted from the surface-emitting laser 1) may be provided with the photodiode 2. Consequently, only light emitted from the surface-emitting laser 1 enters the photodiode 2. This makes it possible to precisely detect the amount of light emitted from the surface-emitting laser 1 without being affected by ambient light.

The integrated circuit chip 20 may include a signal processing circuit, such as a converter circuit that converts a parallel signal to a serial signal. This allows the integrated circuit chip 20 to convert a parallel signal output by a CPU etc. to a serial signal. By driving the surface-emitting laser 1 with the serial signal, the serial signal is incorporated into the front light L1. Examples of the signal processing circuit may include modulator circuits of various types, an A/D converter, a D/A converter, a video signal processing circuit, a voice signal processing circuit, an encryption circuit, and a decryption circuit. The signal processing circuit may be provided on the transparent substrate 10 side.

It is preferable that a gap between the surface-emitting laser 1 and the integrated circuit chip 20 that is flip-chip mounted on the substrate is filled with an underfill. This is because the underfill serves as an adhesive and diffuses stress on the bump 21 of the integrated circuit chip 20, and thereby improves mechanical strength and reliability. Also, the underfill covers the surface-emitting laser 1 and the integrated circuit chip 20 and thereby blocks factors, such as water and oxygen, that deteriorate those elements. Moreover, since the underfill has high thermal conductivity than air, it is effective to release heat from the elements.

The underfill may be made of a transparent material. It is not always preferable, however, that the underfill has high laser light transmittance (transparent). In some cases, it is preferable that the underfill absorbs light to some extent. This is because of the following three reasons. First, since a gap between the surface-emitting laser 1 and the photodiode 2 of the integrated circuit chip 20 is several dozen micrometers wide, the photodiode 2 may perform monitoring even if there is an underfill that has a low transmittance ratio in the gap. Second, if the underfill absorbs light to some extent, it is possible to reduce return light, that is, laser light (the monitor light L2) reflected on the photodiode 2 returns to the surface-emitting laser 1 and affects the operation of the surface-emitting laser 1. Third, it is possible to reduce or prevent the monitor light L2 reflected on the integrated circuit chip 20 from passing through the transparent substrate 10 and being mixed in the front light L1 and from becoming stray light after emerging from a gap between the integrated circuit chip 20 and the transparent substrate 10.

Micro Tile-Like Element Manufacturing Method

Referring now to FIGS. 3 through 12, an exemplary method to manufacture the micro tile-like element of the surface-emitting laser 1 and an exemplary method to adhere the micro tile-like element to the transparent substrate 10 (a final substrate) will be described. The method to manufacture the micro tile-like element is based on an epitaxial liftoff method. While a compound semiconductor device (compound semiconductor element) as the micro tile-like element is adhered to a silicon-LSI chip that is a final substrate in this exemplary embodiment, the invention may be applied to semiconductor devices and LSI chips of any types. Also in this exemplary embodiment, a semiconductor substrate refers to a substance made of a semiconductor material. The shape of the semiconductor substrate may include, but not be limited to a square.

Figure 3:
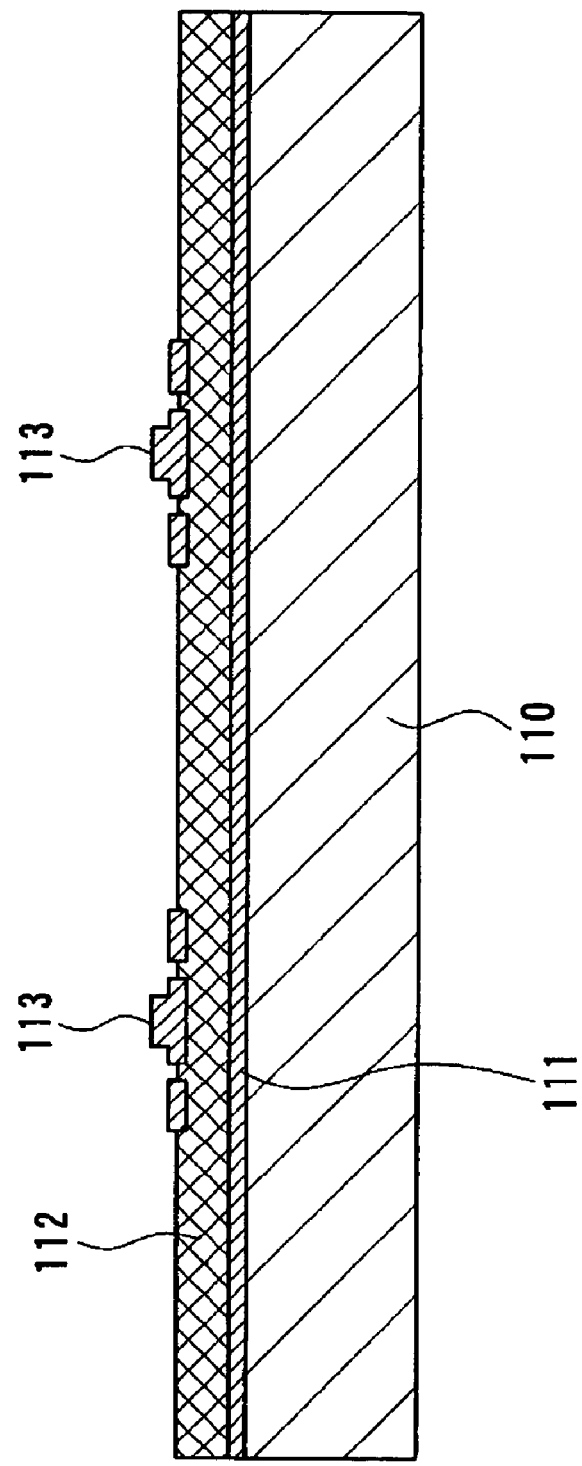
FIG. 3 is a schematic sectional view illustrating a step of an exemplary method to manufacture a semiconductor integrated circuit according to an exemplary embodiment of the invention.

FIG. 3 is a schematic sectional view illustrating a step of a method to manufacture the semiconductor integrated circuit. A substrate 110, shown in FIG. 3, is a semiconductor substrate, for example, a GaAs compound semiconductor substrate. At the bottom of the substrate 110, a sacrifice layer 111 is provided.

The sacrifice layer 111 is made of AlAs, and it is several hundred nanometers deep, for example.

On the sacrifice layer 111, a function layer 112, for example, is provided. The function layer 112 is 1 to 10 (20) micrometers deep, for example. On the function layer 112, a semiconductor device 113 (the surface-emitting laser 1) is deposited. Examples of the semiconductor device 113 may include not only a surface-emitting laser (VCSEL) but also driver circuits and APC circuits composed of other functional elements, such as a high electron mobility transistor (HEMT) and a hetero bipolar transistor (HBT). The semiconductor device 113 composed of any one of these is formed by depositing a number of epitaxial layers on the substrate 110 to make an intended element. The semiconductor device 113 is provided with electrodes and undergoes operational testing.

Figure 4:
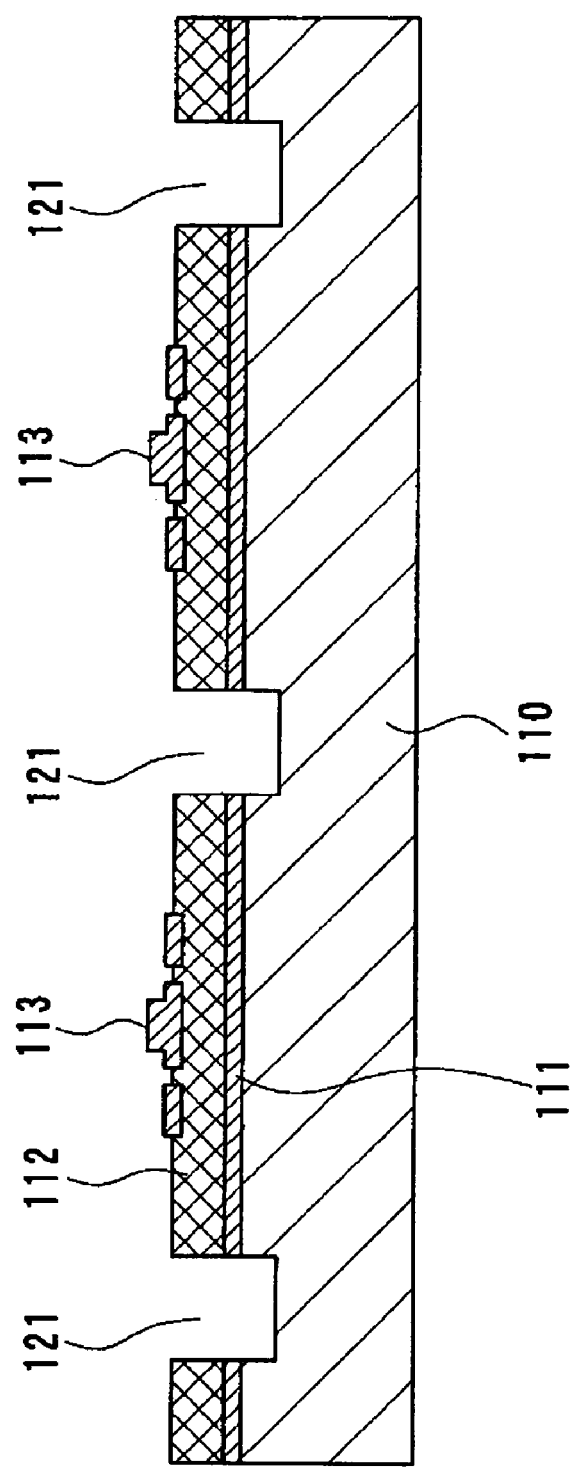
FIG. 4 is a schematic sectional view illustrating a step of an exemplary method to manufacture the semiconductor integrated circuit according to an exemplary embodiment of the invention.

FIG. 4 is a schematic sectional view illustrating a step of the method to manufacture the semiconductor integrated circuit. In this step, a separation trench 121 is provided so as to separate each semiconductor device 113. The separation trench 121 is deep enough to at least reach the sacrifice layer 111. For example, the separation trench is 10 to several hundred micrometers wide and deep. Also, the separation trench 121 is formed without an obstruction in it, so that a selective etchant, that will be described later, flows in the separation trench 121. The separation trench 121 may be arranged in a grid.

By making an interval between each separation trench 121 from several dozen to several hundred micrometers, the size of the semiconductor device 113 separated and formed by the separation trench 121 is set to be from several dozen to several hundred square micrometers. As a method to form the separation trench 121, methods utilizing photolithography and wet or dry etching are used. Alternatively, the separation trench is also formed by dicing a U-shaped groove to an extent that no crack occurs in the substrate.

Figure 5:
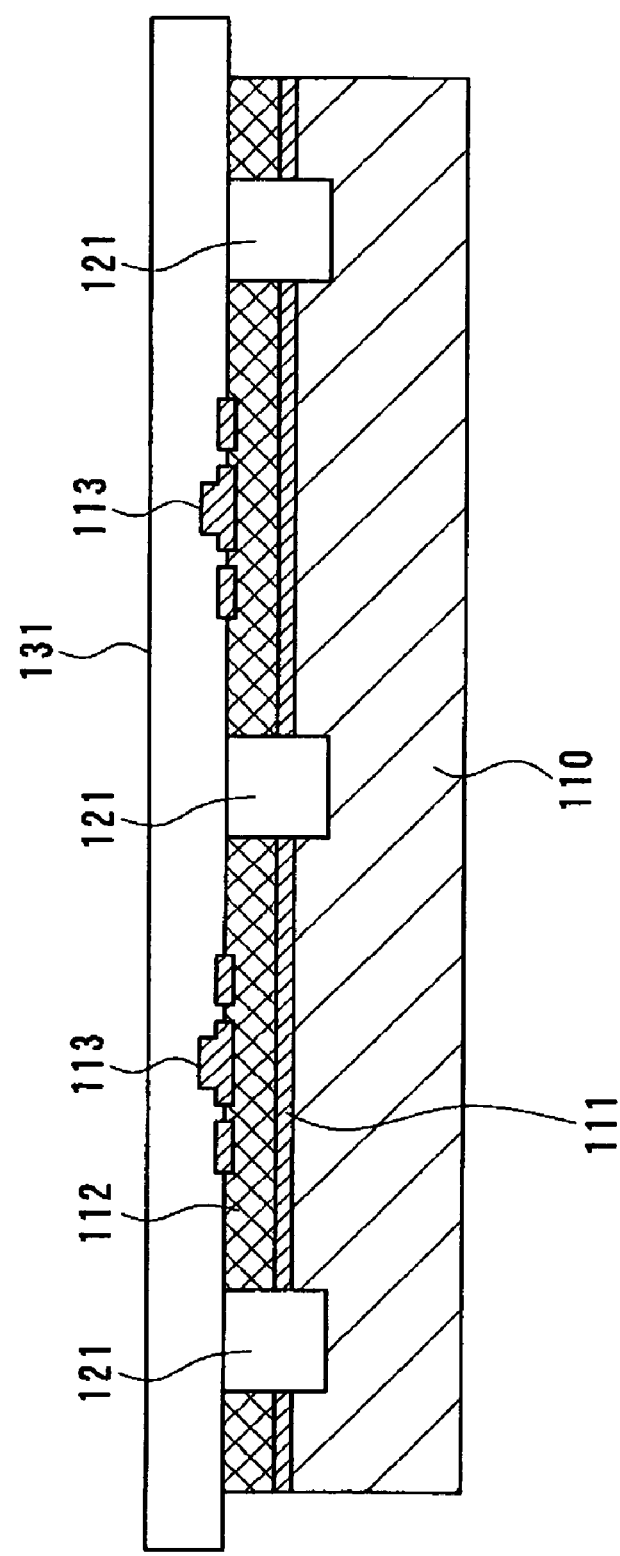
FIG. 5 is a schematic sectional view illustrating a step of an exemplary method to manufacture the semiconductor integrated circuit according to an exemplary embodiment of the invention.

FIG. 5 is a schematic sectional view illustrating a step of the method to manufacture the semiconductor integrated circuit. In this step, an intermediate transfer film 131 is adhered to the surface of the substrate 110 (on the semiconductor device 113 side). The intermediate transfer film 131 is a flexible film on which adhesive is applied.

Figure 6:
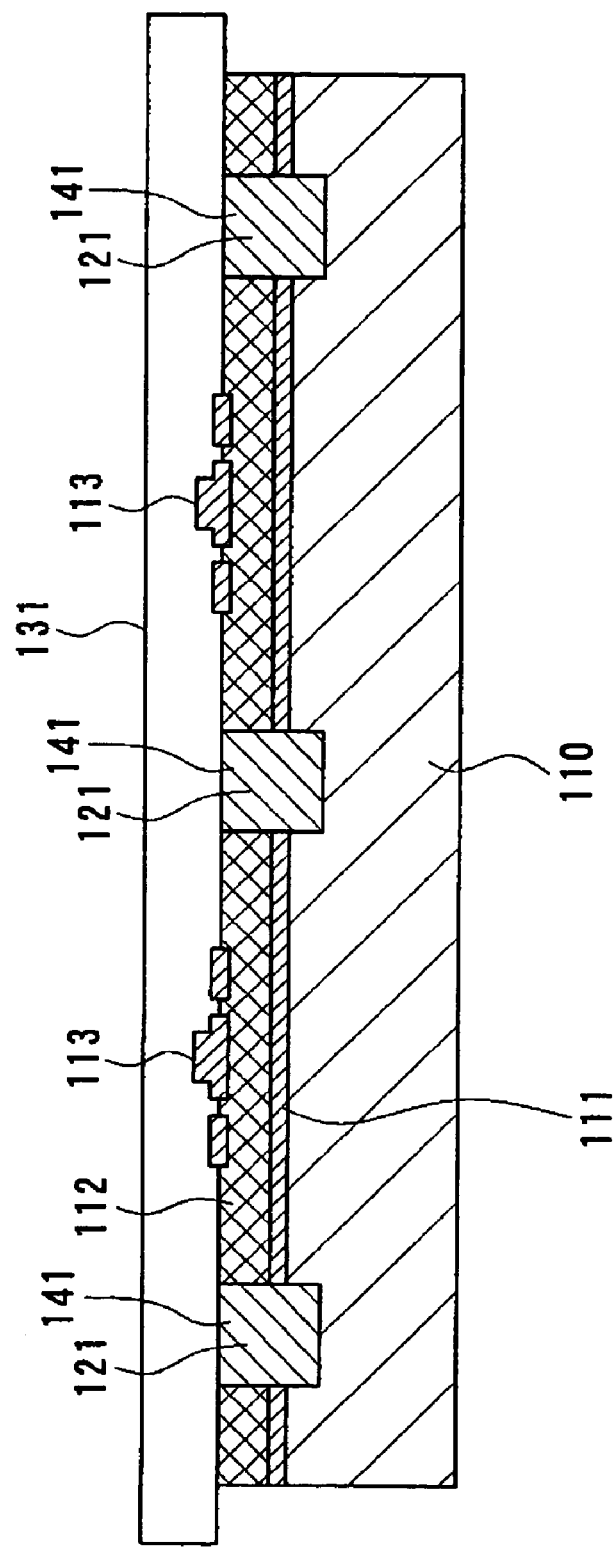
FIG. 6 is a schematic sectional view illustrating a step of an exemplary method to manufacture the semiconductor integrated circuit according to an exemplary embodiment of the invention.

FIG. 6 is a schematic sectional view illustrating a step of the method to manufacture the semiconductor integrated circuit. In this step a selective etchant 141 is injected in the separation trench 121. In order to selectively etch the sacrifice layer 111, low-concentration hydrochloric acid, which is highly selective to AlAs, as the selective etchant 141.

Figure 7:
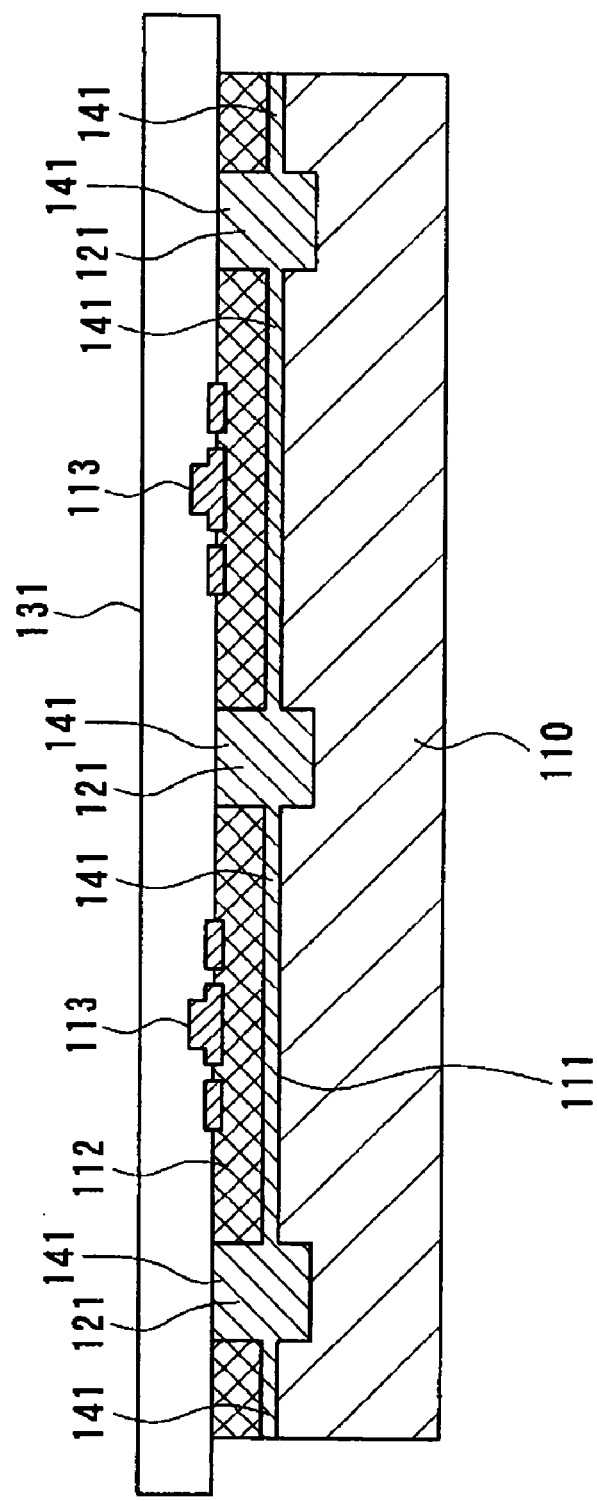
FIG. 7 is a schematic sectional view illustrating a step of an exemplary method to manufacture the semiconductor integrated circuit according to an exemplary embodiment of the invention.

FIG. 7 is a schematic sectional view illustrating a step of the method to manufacture the semiconductor integrated circuit. After a predetermined period of time passes following the step in which the selective etchant 141 is injected in the separation trench 121, all of the sacrifice layer 111 is selectively etched and removed from the substrate 110 in this step.

Figure 8:
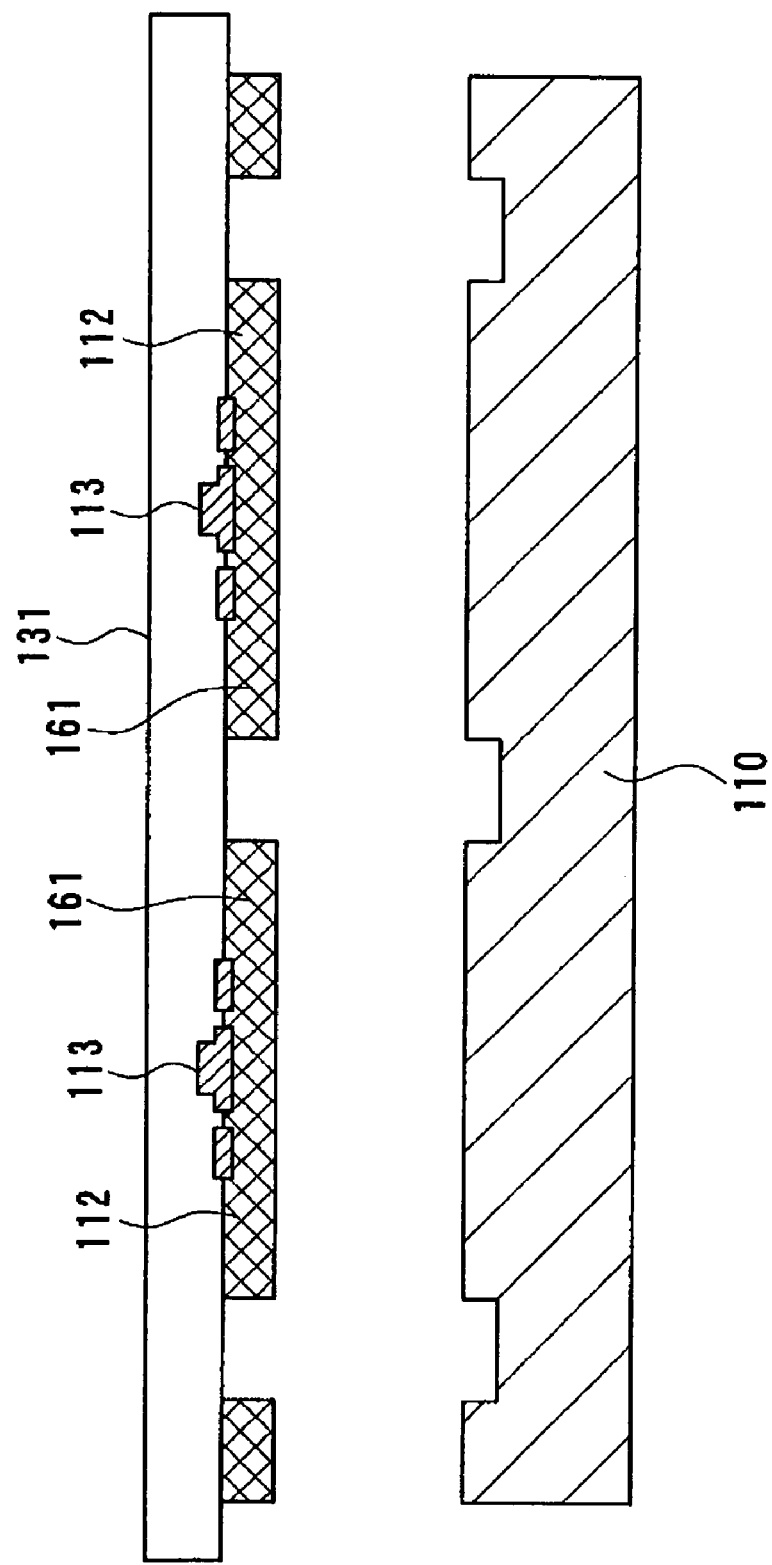
FIG. 8 is a schematic sectional view illustrating a step of an exemplary method to manufacture the semiconductor integrated circuit according to an exemplary embodiment of the invention.

FIG. 8 is a schematic sectional view illustrating a step of the method to manufacture the semiconductor integrated circuit. As all of the sacrifice layer 111 is etched in the previous step, the function layer 112 is detached from the substrate 110. Subsequently, the function layer 112, adhered to the intermediate transfer film 131, is separated from the substrate 110 by separating the intermediate transfer film 131 from the substrate 110 in this step.

Thus, the function layer 112, on which the semiconductor device 113 is deposited, is separated through forming the separation trench 121 and etching of the sacrifice layer 111 to be a semiconductor element (corresponding to the surface-emitting laser 1 in the above-mentioned embodiment) of an intended shape (for example, a micro tile-like shape). Thus, the function layer 112 is retained on the intermediate transfer film 131. Here, it is preferable that the function layer is, for example, from 1 to 10 micrometers deep and from several dozen to several hundred micrometers long and wide.

Figure 9:
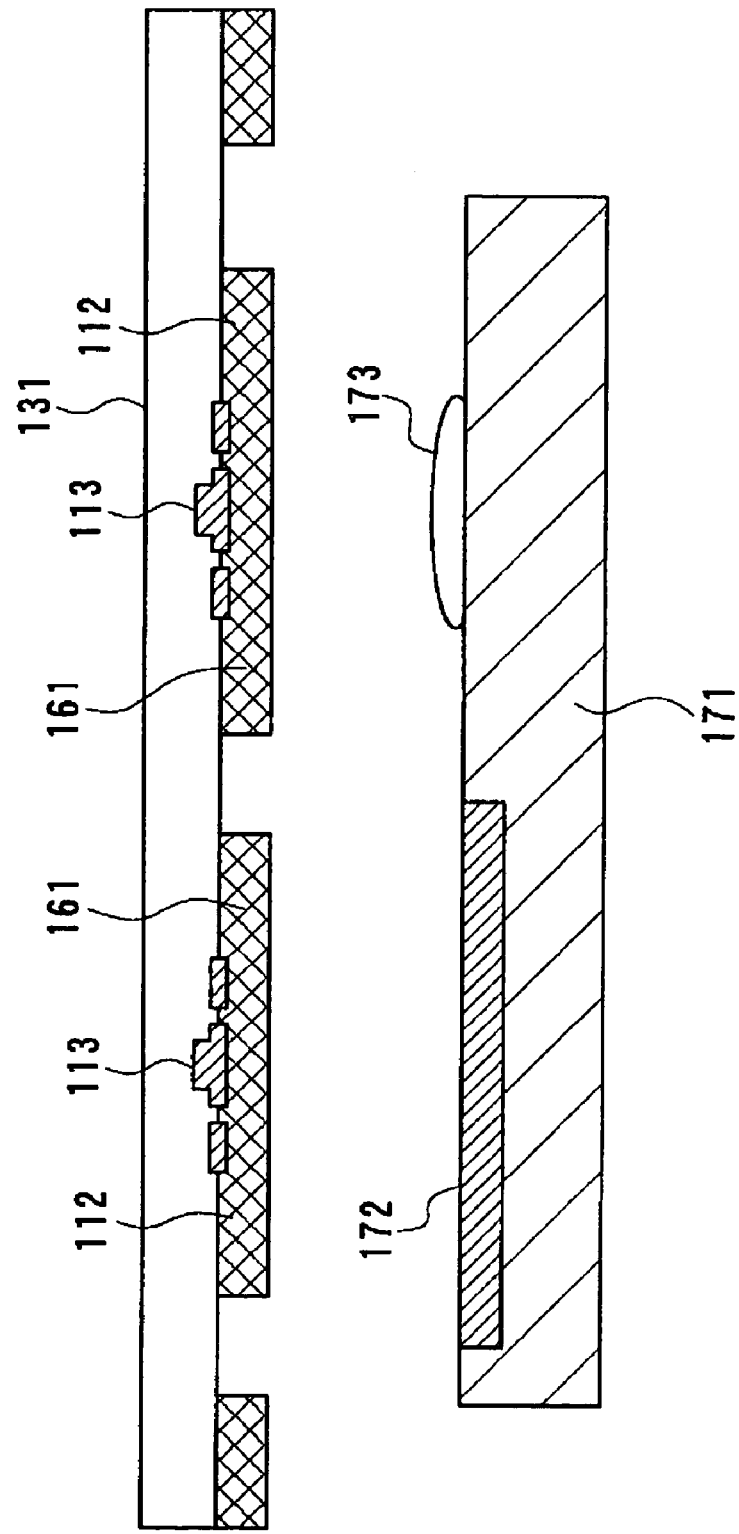
FIG. 9 is a schematic sectional view illustrating a step of an exemplary method to manufacture the semiconductor integrated circuit according to an exemplary embodiment of the invention.

FIG. 9 is a schematic sectional view illustrating a step of the method to manufacture the semiconductor integrated circuit. In this step, by adjusting a position of the intermediate transfer film 131, on which a micro tile-like element 161 is adhered, the micro tile-like element 161 (the surface-emitting laser 1) is aligned to an intended position on a final substrate 171 (the transparent substrate 10). Here, the final substrate 171 is composed of silicon semiconductor, for example, on which an LSI region 172 is formed. On the intended position on the final substrate 171, an adhesive 173 to adhere the micro tile-like element 161 is applied. The adhesive may be applied to the micro tile-like element.

Figure 10:
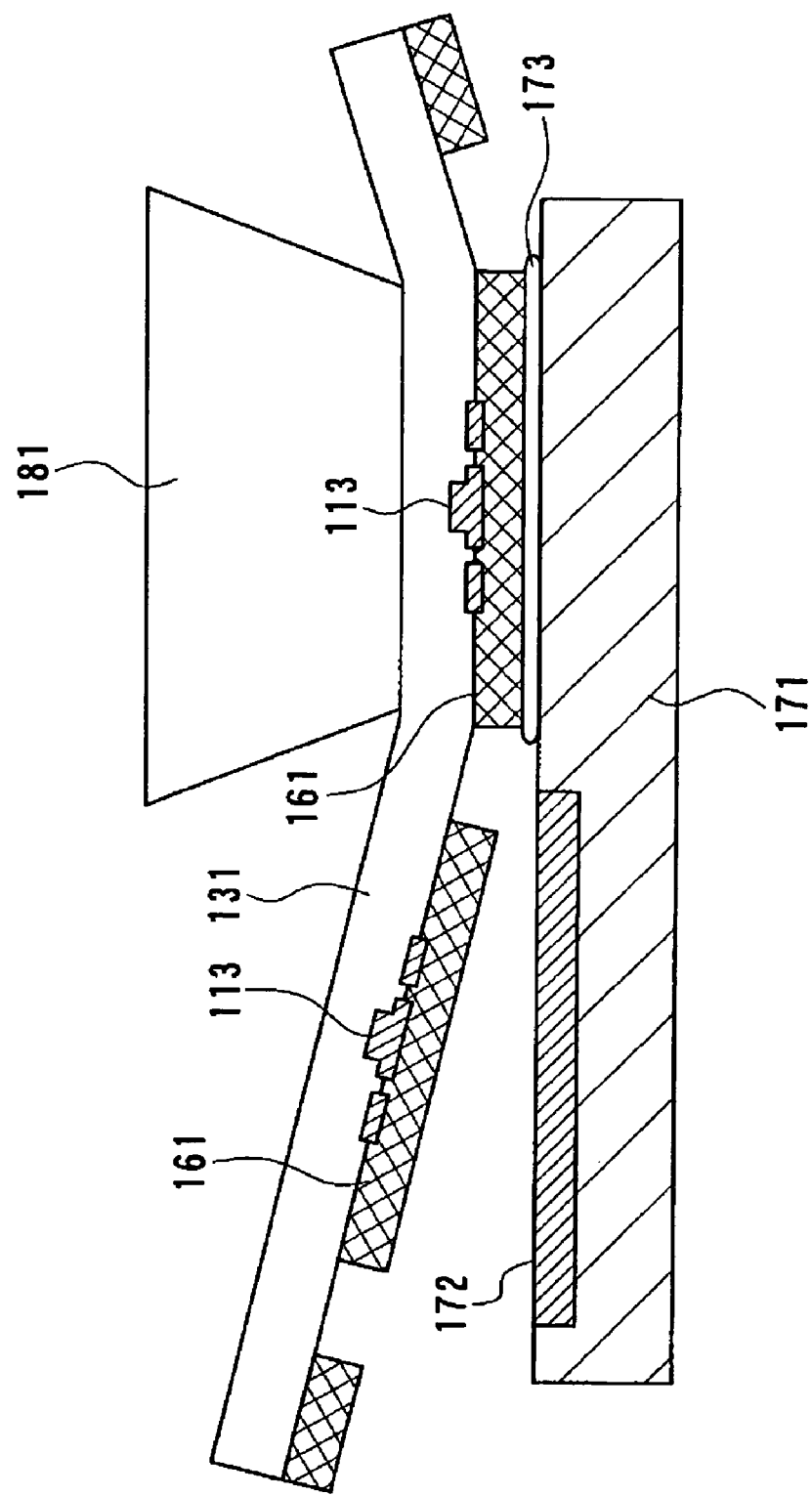
FIG. 10 is a schematic sectional view illustrating a step of an exemplary method to manufacture the semiconductor integrated circuit according to an exemplary embodiment of the invention.

FIG. 10 is a schematic sectional view illustrating a step of the method to manufacture the semiconductor integrated circuit. In this step, the micro tile-like element 161, aligned to the intended position on the final substrate 171, is adhered to the final substrate via the intermediate transfer film 131 by being pressed by a push pin 181. Since the adhesive 173 is applied to the intended position, the micro tile-like element 161 is adhered to the intended position on the final substrate 171.

Figure 11:
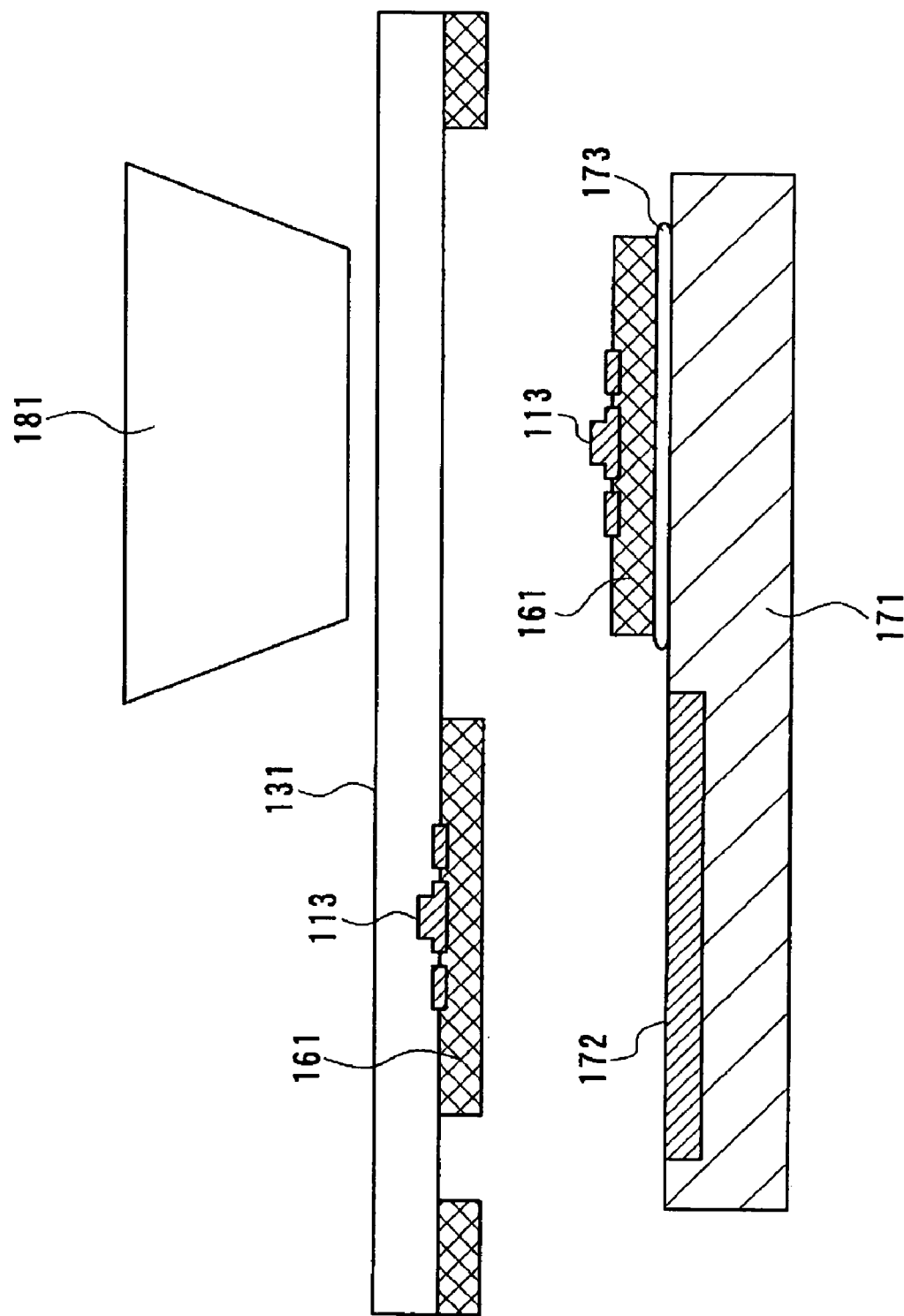
FIG. 11 is a schematic sectional view illustrating a step of an exemplary method to manufacture the semiconductor integrated circuit according to an exemplary embodiment of the invention.

FIG. 11 is a schematic sectional view illustrating a step of the method to manufacture the semiconductor integrated circuit. In this step, the intermediate transfer film 131 is detached from the micro tile-like element 161 by making the intermediate transfer film 131 lose an adhesive force.

To accomplish this, UV-cured or thermosetting adhesive is used for the intermediate transfer film 131. When using UV-cured adhesive, by using the push pin 181 made of a transparent material and irradiating UV rays from an end of the push pin 181, the intermediate transfer film 131 loses its adhesive force. When using thermosetting adhesive, the push pin 181 is heated to accomplish this. Alternatively, it is possible to make the intermediate transfer film 131 lose its adhesive force, for example, by irradiating UV rays on its whole surface. Here, the adhesive force is lost, but there is still an adhesive force strong enough to retain the micro tile-like element 161 that is thin on the intermediate transfer film 131.

In another step (not shown), the micro tile-like element 161 is firmly adhered to the final substrate 171, for example, by a heating process.

Figure 12:
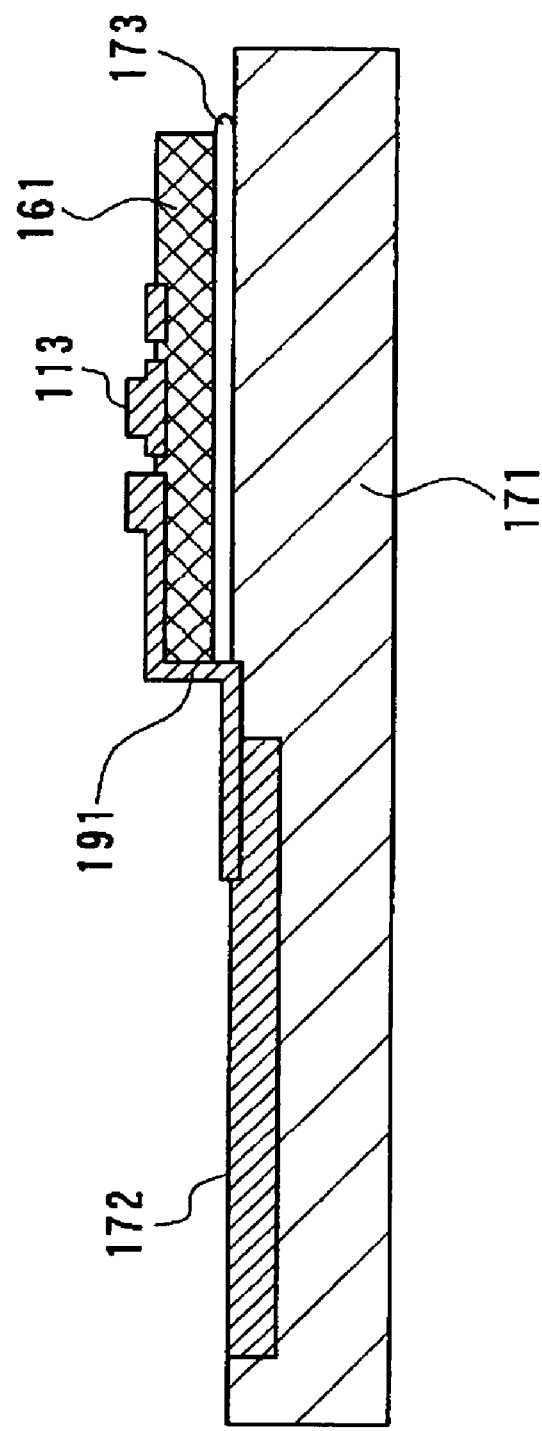
FIG. 12 is a schematic sectional view illustrating a step of an exemplary method to manufacture the semiconductor integrated circuit according to an exemplary embodiment of the invention.

FIG. 12 is a schematic sectional view illustrating a step of the method to manufacture the semiconductor integrated circuit.

In this step, electrodes of the micro tile-like element 161 (the surface-emitting laser 1) and a circuit on the final substrate 171 (the transparent substrate 10) with a wiring 191 are electrically coupled, which completes a semiconductor integrated circuit, such as an LSI chip. Examples of the final substrate 171 may include not only silicon substrate but also a glass substrate, quartz substrate, and plastic film.

This makes it possible to form a semiconductor element forming the surface-emitting laser 1 on a substrate made of a different material from that of the semiconductor substrate, for example, the surface-emitting laser 1 made of GaAs is formed on an intended position of the transparent substrate 10 made of plastic as the final substrate 171. Also, since a micro tile-like element is cut out and separated after the surface-emitting laser 1 is formed on a semiconductor substrate, it is possible to select the surface-emitting laser 1 through testing in advance.

According to the above-mentioned exemplary manufacturing method, only the function layer including a semiconductor element (the surface-emitting laser 1) is separated from the semiconductor substrate as the micro tile-like element and mounted on the film to be handled. Thus, it is possible to selectively adhere each surface-emitting laser 1 to the transparent substrate 10, which enables the miniaturization of the surface-emitting laser 1, compared to lasers made of related art methods. Therefore, it is possible to easily and economically provide a semiconductor integrated circuit that outputs laser light of an intended light amount and intended state, and is compact in size.

Electronic Equipment

Electronic equipment including the semiconductor integrated circuit according to the above-mentioned exemplary embodiments will be now described.

Figure 13:
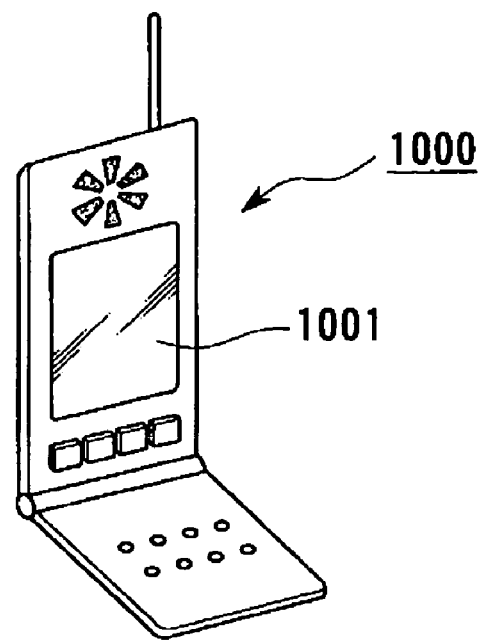
FIG. 13 shows an example of electronic equipment including the semiconductor integrated circuit according to an exemplary embodiment of the invention.

FIG. 13 is a perspective view showing an example of cellular phones. FIG. 13 shows a cellular phone 1000 including the semiconductor integrated circuit and a display 1001.

Figure 14:
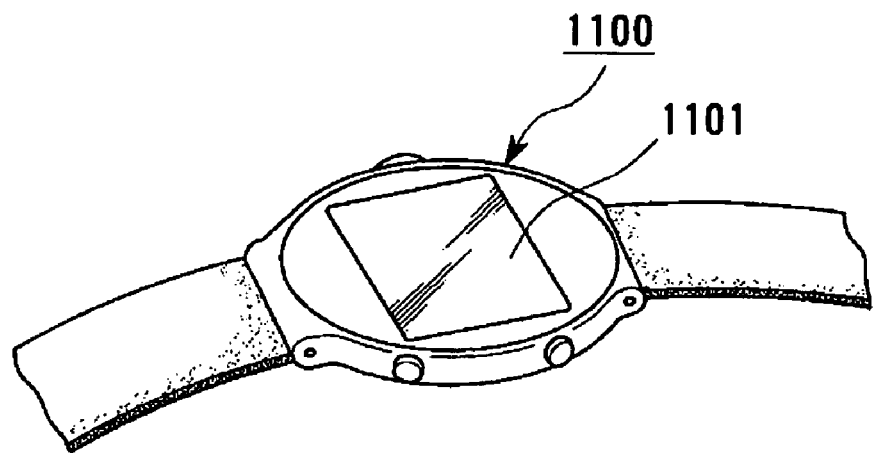
FIG. 14 shows an example of electronic equipment including the semiconductor integrated circuit according to an exemplary embodiment of the invention.

FIG. 14 is a perspective view showing an example of watch electronic equipment. FIG. 14 shows a watch 1100 including the semiconductor integrated circuit and a display 1101.

Figure 15:
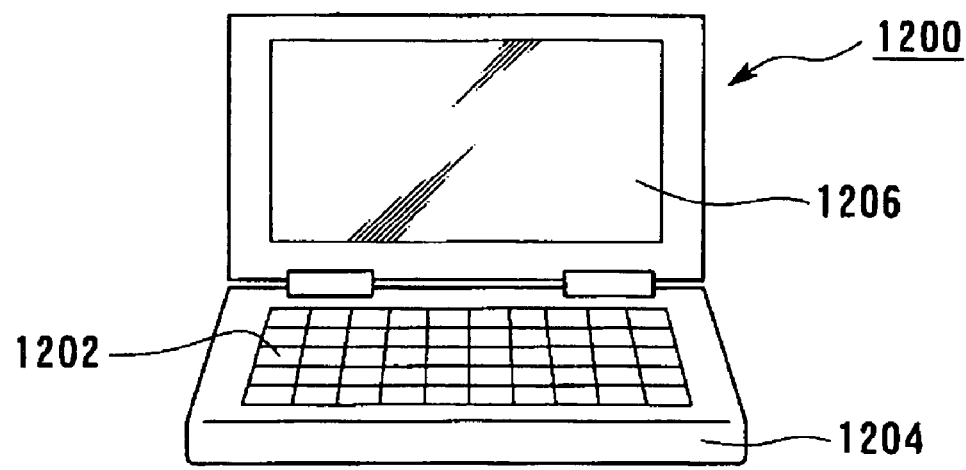
FIG. 15 shows an example of electronic equipment including the semiconductor integrated circuit according to an exemplary embodiment of the invention.
Figure 16:
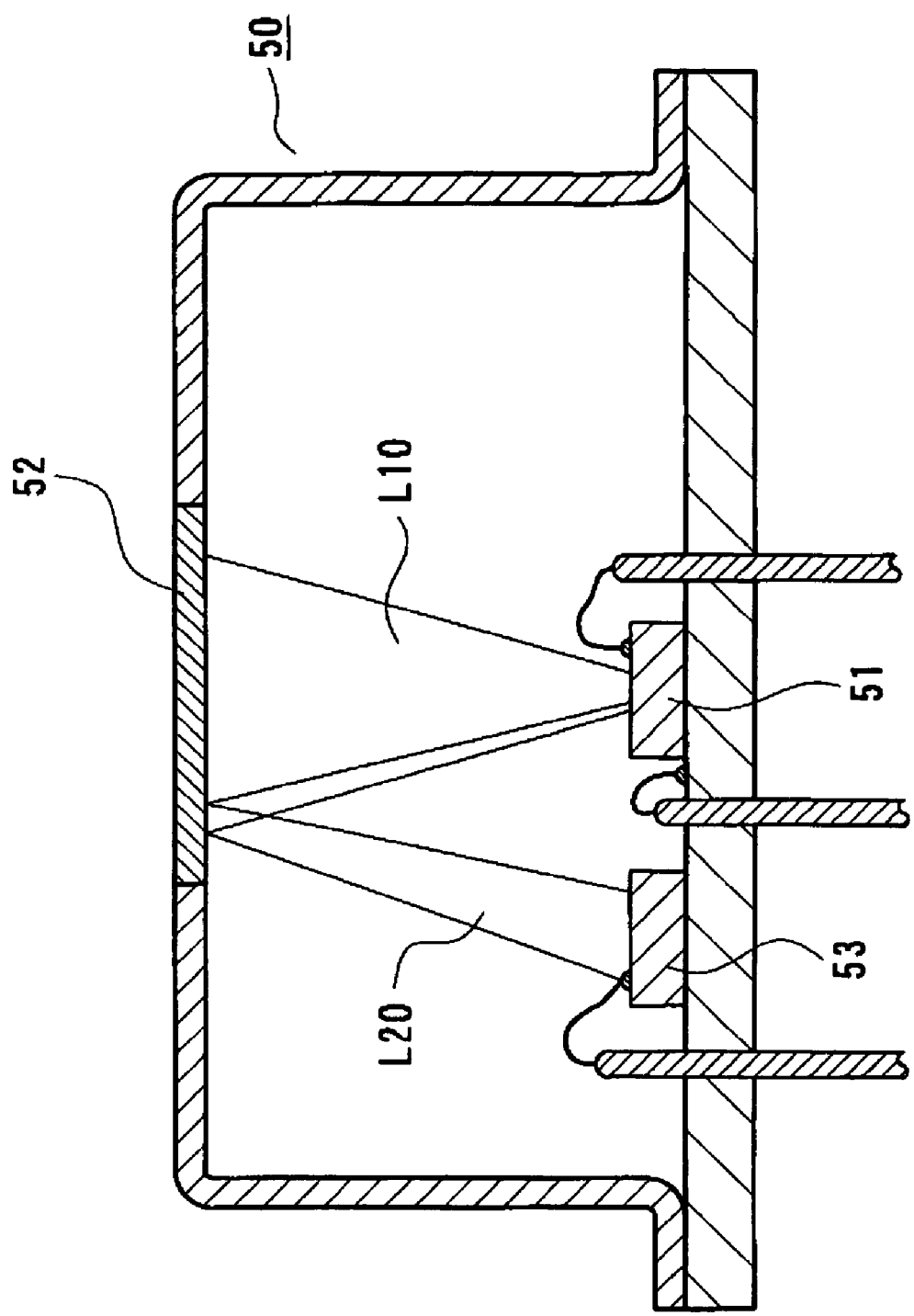
FIG. 16 shows a related art device to monitor the amount of light emitted from a surface-emitting laser.

FIG. 15 is a perspective view showing an example of portable information processing devices, such as a word processor and a computer. FIG. 15 shows an information processing device 1200 including an input device 1202, such as a keyboard, an information processing body 1204 including the semiconductor integrated circuit and a display 1206.

Since the electronic equipment shown in FIGS. 13 through 15 include the semiconductor integrated circuit according to the above-mentioned exemplary embodiments, they are capable of transmitting and detecting signals using laser light, operating at high speed and stably for a long period of time and being manufactured at low cost.

It should be noted that the present invention is not limited to the above-mentioned exemplary embodiments, and various modifications can be made within the scope of the invention. The materials and layer configurations described in the exemplary embodiments are an example of applications of the invention and may be subject to change if required.

What is claimed is:

1. A semiconductor integrated circuit having a surface-emitting laser, comprising:
   a transparent substrate;
   the surface-emitting laser composed of a different material than the transparent substrate, the surface-emitting laser adhered to the transparent substrate by an adhesive; and
   an integrated circuit chip that is flip-chip mounted on the transparent substrate and arranged to cover the surface-emitting laser; the integrated circuit chip including a light receiving device that is arranged so as to face the surface-emitting laser.

2. The semiconductor integrated circuit having a surface-emitting laser according to claim 1,
   the light receiving device being a photodiode.

3. The semiconductor integrated circuit having a surface-emitting laser according to claim 2,
   the photodiode being an MSM photodiode.

4. The semiconductor integrated circuit having a surface-emitting laser according to claim 1,
   a light receiving part of the light receiving device being positioned on an optical axis of the surface-emitting laser.

5. The semiconductor integrated circuit having a surface-emitting laser according to claim 1,
   the integrated circuit chip including an auto power control circuit that controls an amount of light emitted by the surface-emitting laser based on an amount of light detected by the light receiving device.

6. The semiconductor integrated circuit having a surface-emitting laser according to claim 1,
   the integrated circuit chip including a signal processing circuit and an output signal of the signal processing circuit being an input signal to the surface-emitting laser.

7. The semiconductor integrated circuit having a surface-emitting laser according to claim 1,
   the transparent substrate including an auto power control circuit that controls an amount of light emitted by the surface-emitting laser based on an amount of light detected by the light receiving device.

8. The semiconductor integrated circuit having a surface-emitting laser according to claim 1,
   the transparent substrate including signal processing circuit and an output signal of the signal processing circuit being an input signal to the surface-emitting laser.

9. The semiconductor integrated circuit having a surface-emitting laser according to claim 1,
   the transparent substrate including a lens that is positioned on an optical axis of the surface-emitting laser.

10. The semiconductor integrated circuit having a surface-emitting laser according to claim 9,
    the surface-emitting laser being adhered to a surface of the transparent substrate and the lens being provided to a back surface of the transparent substrate.

11. The semiconductor integrated circuit having a surface-emitting laser according to claim 1,
    the transparent substrate including a diffraction grating that is positioned on an optical axis of the surface-emitting laser.

12. The semiconductor integrated circuit having a surface-emitting laser according to claim 11,
    the surface-emitting laser being adhered to a surface of the transparent substrate and the diffraction grating being provided to a back surface of the transparent substrate.

13. The semiconductor integrated circuit having a surface-emitting laser according to claim 1,
    the light receiving device having wavelength selectivity.

14. The semiconductor integrated circuit having a surface-emitting laser according to claim 13,
    a light receiving part of the light receiving device being provided with a filter that transmits only light of a predetermined wavelength.

15. The semiconductor integrated circuit having a surface-emitting laser according to claim 1,
    the surface-emitting laser including a lower multilayered reflective layer, an active layer that is provided above the lower multilayered reflective layer, and an upper multilayered reflective layer that is provided above the active layer.

* * * * *